(12) United States Patent
Son (10) Patent No.: US 11,289,275 B2
(45) Date of Patent: Mar. 29, 2022

(54) COMPOSITE ELECTRONIC COMPONENT

(71) Applicant: SAMSUNG ELECTRO-MECHANICS CO., LTD., Suwon-si (KR)

(72) Inventor: Soo Hwan Son, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 21 days.

(21) Appl. No.: 17/024,927

(22) Filed: Sep. 18, 2020

(65) Prior Publication Data

US 2021/0159017 A1    May 27, 2021

(30) Foreign Application Priority Data

Nov. 25, 2019    (KR) .......................... 10-2019-0152177

(51) Int. Cl.
*H01G 4/30*    (2006.01)
*H01G 4/40*    (2006.01)
(Continued)

(52) U.S. Cl.
CPC .................. *H01G 4/30* (2013.01); *H01G 4/12* (2013.01); *H01G 4/248* (2013.01); *H01G 4/40* (2013.01)

(58) Field of Classification Search
CPC ............ H01G 4/30; H01G 4/12; H01G 4/248; H01G 4/40
See application file for complete search history.

(56) References Cited

U.S. PATENT DOCUMENTS 10,483,040 B1    11/2019    Kim et al.
10,553,362 B1 *    2/2020    Sim ........................ H01G 2/065
(Continued)

FOREIGN PATENT DOCUMENTS

JP    5012658 B2    6/2012
JP    2013-65820 A    4/2013
(Continued)

OTHER PUBLICATIONS

Office Action issued in corresponding Korean Patent Application No. 10-2019-0152177 dated Feb. 23, 2021, with English translation.

*Primary Examiner* — Dion R. Ferguson
(74) *Attorney, Agent, or Firm* — Morgan, Lewis & Bockius LLP (57) ABSTRACT

A composite electronic component includes a composite body including a multilayer ceramic capacitor including a first ceramic body in which dielectric layers and internal electrodes disposed to oppose each other with a respective one of the dielectric layers interposed therebetween are layered, and first and second external electrodes disposed on both ends of the first ceramic body; and a ceramic chip disposed below the multilayer ceramic capacitor and including a second ceramic body including ceramic, and first and second terminal electrodes disposed on both ends of the second ceramic body and respectively connected to the first and second external electrodes. A ratio (G1/M1) of a spacing distance (G1) between the first ceramic body and the second ceramic body in a thickness direction to a length (M1) of a margin portion between the internal electrode and a lower surface of the first ceramic body satisfies 1.0 to 2.5.

16 Claims, 4 Drawing Sheets

(51) Int. Cl.
*H01G 4/12* (2006.01)
*H01G 4/248* (2006.01)

(56) References Cited

U.S. PATENT DOCUMENTS

| | | | | |
|---|---|---|---|---|
| 2013/0033836 A1* | 2/2013 | Hattori | ............ | H01G 4/30 |
| | | | | 361/768 |
| 2013/0056252 A1* | 3/2013 | Fujii | ............ | H05K 1/16 |
| | | | | 174/260 |
| 2013/0321981 A1* | 12/2013 | Ahn | ............ | H01G 4/30 |
| | | | | 361/321.2 |
| 2013/0329389 A1* | 12/2013 | Hattori | ............ | H05K 3/341 |
| | | | | 361/782 |
| 2016/0093439 A1* | 3/2016 | Fujita | ............ | H01G 4/228 |
| | | | | 361/301.4 |
| 2018/0158608 A1* | 6/2018 | Fujita | ............ | H01G 4/224 |
| 2019/0066918 A1* | 2/2019 | Jeong | ............ | H05K 3/3442 |
| 2020/0082979 A1* | 3/2020 | Kim | ............ | H01G 4/2325 |
| 2020/0105474 A1* | 4/2020 | Son | ............ | H05K 1/181 |
| 2020/0118744 A1* | 4/2020 | Sim | ............ | H05K 3/3442 |
| 2020/0126720 A1* | 4/2020 | Son | ............ | H01G 4/2325 |

FOREIGN PATENT DOCUMENTS

| | | |
|---|---|---|
| JP | 2016-72603 A | 5/2016 |
| KR | 10-2019-0121184 A | 10/2019 |
| KR | 10-2019-0121206 A | 10/2019 |
| KR | 10-2032759 B1 | 10/2019 |

* cited by examiner

COMPOSITE ELECTRONIC COMPONENT

CROSS-REFERENCE TO RELATED APPLICATION(S)

This application claims benefit of priority to Korean Patent Application No. 10-2019-0152177 filed on Nov. 25, 2019 in the Korean Intellectual Property Office, the disclosure of which is incorporated herein by reference in its entirety.

TECHNICAL FIELD

The present disclosure relates to a composite electronic component.

BACKGROUND

A multilayer ceramic capacitor, a type of electronic multilayer chip component, may be a chip-type condenser mounted on a circuit substrate of various electronic products such as an imaging device including a liquid crystal display (LCD) and a plasma display panel (PDP), a computer, a personal digital assistant (PDA), a mobile phone, and the like, and may charge or discharge electricity.

Such a multilayer ceramic capacitor (MLCC) may be used as a component of various electronic devices as an MLCC may be small-sized, may secure high capacitance, and may be easily mounted.

An MLCC may have a structure in which a plurality of dielectric layers and internal electrodes having different polarities, which may be disposed between the dielectric layers, may be alternately layered.

As a dielectric layer has piezoelectricity and total distortion, when a direct current voltage or an alternating current voltage is applied to an MLCC, a piezoelectric phenomenon may occur between the internal electrodes such that vibrations may occur.

Such vibrations may be transmitted to a circuit substrate on which the MLCC is mounted through an external electrode of the MLCC such that the entire circuit substrate may become an acoustic reflective surface and may generate vibration sound, which may be experienced as noise.

The vibration sound may be in an audible frequency between 20 and 20,000 Hz, and such vibration sound which causes listener discomfort is referred to as acoustic noise.

Such acoustic noise may be perceivable to a user as an electronic device has been designed to have a slim and reduced size and has been used in an environment in which a voltage and changes in voltage are relatively high, along with a printed circuit board.

Accordingly, there has been continuous demand for a product with reduced acoustic noise.

To reduce acoustic noise, there have been studies on a composite electronic component in which a substrate is used on a lower surface of an MLCC.

However, specific studies on a size of an MLCC, a mounting method, a size of a ceramic chip disposed in a lower portion, and a degree of removal of acoustic noise according to a size of an electrode have not been properly conducted. Thus, it has been necessary to conduct studies on a threshold in relation to a degree of an effect of acoustic noise according to a distance between an MLCC and a ceramic chip disposed on a lower surface, and a gap between lower margin portions of internal electrodes disposed in an MLCC.

SUMMARY

An aspect of the present disclosure is to provide a composite electronic component which may reduce acoustic noise.

According to an aspect of the present disclosure, a composite electronic component includes a composite body including a multilayer ceramic capacitor including a first ceramic body in which a plurality of dielectric layers and internal electrodes disposed to oppose each other with a respective one of the plurality of dielectric layers interposed therebetween are layered, and first and second external electrodes disposed on both ends of the first ceramic body; and a ceramic chip disposed below the multilayer ceramic capacitor and including a second ceramic body including ceramic, and first and second terminal electrodes disposed on both ends of the second ceramic body and respectively connected to the first and second external electrodes. A ratio (G1/M1) of a spacing distance (G1) between the first ceramic body and the second ceramic body in a thickness direction to a length (M1) of a margin portion between the internal electrode and a lower surface of the first ceramic body satisfies 1.0 to 2.5.

According to another aspect of the present disclosure, a composite electronic component includes a composite body including a multilayer ceramic capacitor including a first ceramic body in which a plurality of dielectric layers and internal electrodes disposed to oppose each other with a respective one of the plurality of dielectric layers interposed therebetween are layered, and first and second external electrodes disposed on both ends of the first ceramic body; and a ceramic chip disposed below the multilayer ceramic capacitor and including a second ceramic body including ceramic, and first and second terminal electrodes disposed on both ends of the second ceramic body and respectively connected to the first and second external electrodes. A length (M1) of a margin portion between the internal electrode and a lower surface of the first ceramic body and a spacing distance (G1) between the first ceramic body and the second ceramic body in a thickness direction satisfy M1<G1.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art. Accordingly, shapes and sizes of the elements in the drawings can be exaggerated for clear description. Also, elements having the same function within the scope of the same concept represented in the drawing of each exemplary embodiment will be described using the same reference numeral.

A value used to describe a parameter such as a 1-D dimension of an element including, but not limited to, "length," "width," "thickness," "diameter," "distance," "gap," and/or "size," a 2-D dimension of an element including, but not limited to, "area" and/or "size," a 3-D dimension of an element including, but not limited to, "volume" and/or "size", and a property of an element including, not limited to, "roughness," "density," "weight," "weight ratio," and/or "molar ratio" may be obtained by the method(s) and/or the tool(s) described in the present disclosure. The present disclosure, however, is not limited thereto. Other methods and/or tools appreciated by one of ordinary skill in the art, even if not described in the present disclosure, may also be used.

Composite Electronic Component

Figure 1:
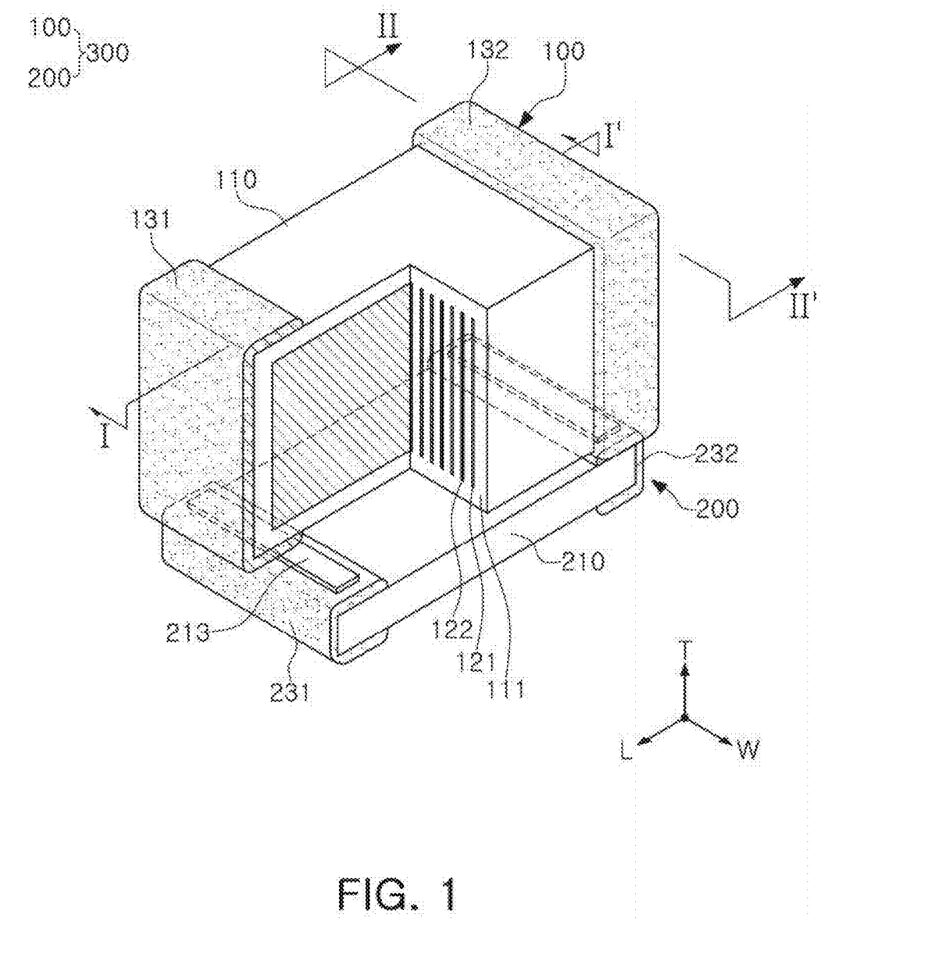
FIG. 1 is a perspective diagram illustrating a composite electronic component according to a first example embodiment of the present disclosure.

FIG. 1 is a perspective diagram illustrating a composite electronic component according to a first example embodiment.

Figure 2:
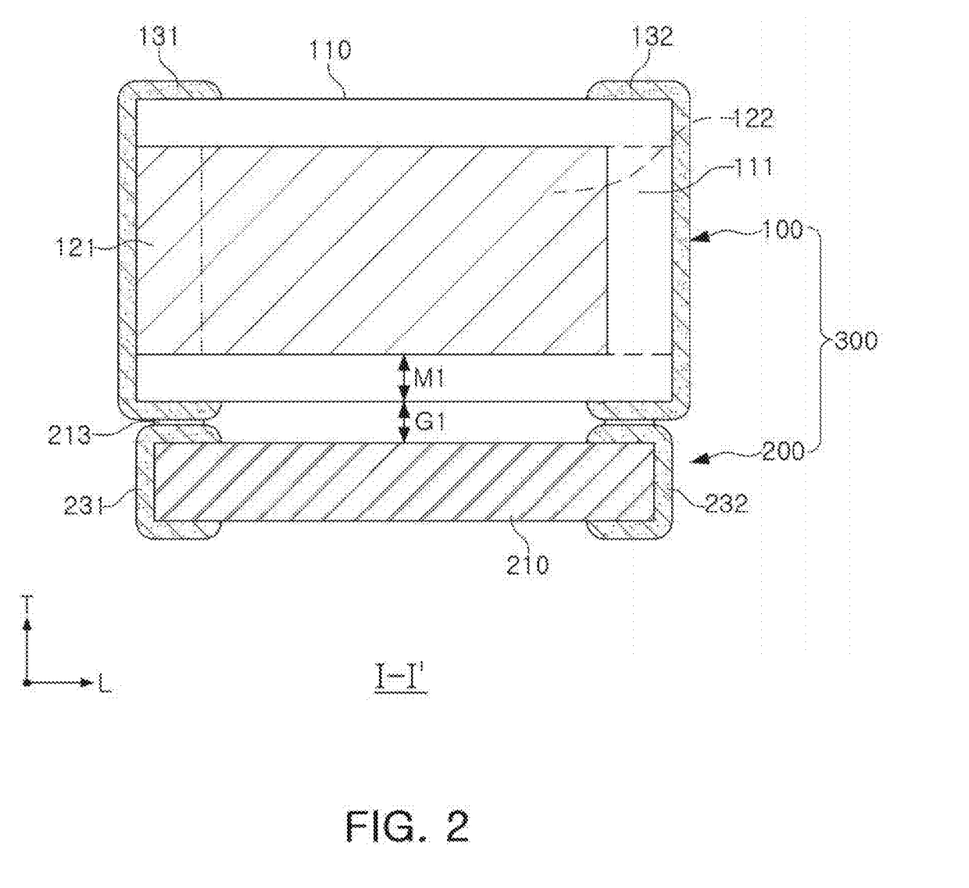
FIG. 2 is a cross-sectional diagram along line I-I' in FIG. 1.

FIG. 2 is a cross-sectional diagram along line I-I' in FIG. 1.

Figure 3:
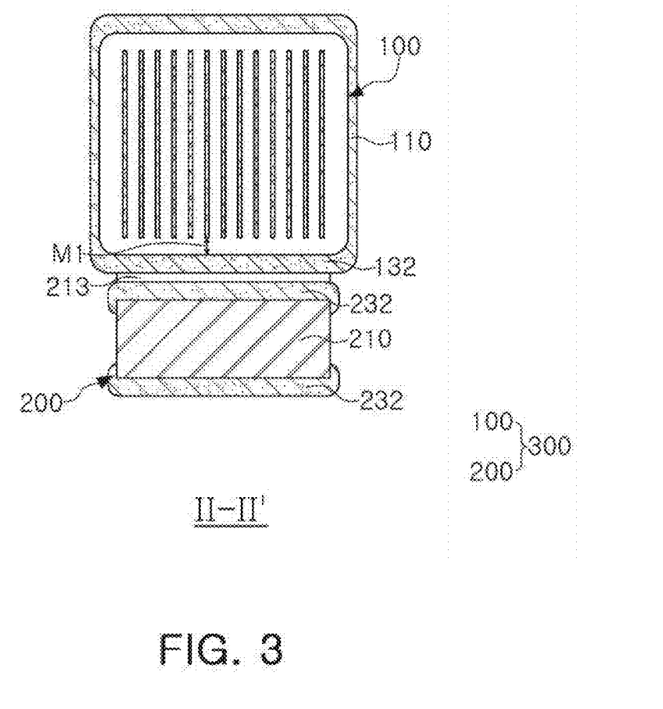
FIG. 3 is a cross-sectional diagram along line II-II' in FIG. 1.

FIG. 3 is a cross-sectional diagram along line II-II' in FIG. 1.

Referring to FIG. 1, with respect to a composite electronic component in the example embodiment, "a length direction" may be defined as an "L" direction, "a width direction" may be defined as a "W" direction, and "a thickness direction" may be defined as a "T" direction. The "thickness direction" may be the same as "a stacking direction" along which a ceramic chip and a multilayer ceramic capacitor are stacked.

Also, in an example embodiment, the composite electronic component may have an upper surface and a lower surface opposing each other, and a first side surface and a second side surface disposed in a length direction and a third side surface and a fourth side surface disposed in a width direction, which connect the upper and lower surfaces. A shape of the composite electronic component is not limited to any particular shape, but may have a hexahedral shape as illustrated in the diagram.

Also, the first side surface and the second side surface disposed in the length direction and the third side surface and the fourth side surface disposed in the width direction of the composite electronic component may be disposed in directions the same as directions in which a first side surface and a second side surface disposed in a length direction and a third side surface and a fourth side surface disposed in a width direction of a multilayer ceramic capacitor and a ceramic chip, respectively.

Also, in the composite electronic component, the multilayer ceramic capacitor and the ceramic chip may be bonded to each other. When the ceramic chip is bonded to a lower portion of the multilayer ceramic capacitor, an upper surface of the composite electronic component may be defined as an upper surface of the multilayer ceramic capacitor, and a lower surface of the composite electronic component may be defined as a lower surface of the ceramic chip.

Referring to FIGS. 1 and 2, the composite electronic component in the first example embodiment may include a composite body 300 including a multilayer ceramic capacitor 100 which includes a first ceramic body 110 in which a plurality of dielectric layers 111 and internal electrodes 121 and 122 disposed to oppose each other with the dielectric layer 111 interposed therebetween are layered and first and second external electrodes 131 and 132 disposed on both ends of the first ceramic body 110, and a ceramic chip 200 disposed below the multilayer ceramic capacitor 100 and including a second ceramic body 210 including ceramic, and first and second terminal electrodes 231 and 232 disposed on both ends of the second ceramic body 210 and connected to the first and second external electrodes 131 and 132, where the multilayer ceramic capacitor 100 and the ceramic chip 200 are bonded to each other.

The ceramic may include alumina ($Al_2O_3$).

Generally, to reduce vibrations of a multilayer ceramic capacitor which may be transmitted to a printed circuit board, an intermediate medium may be inserted between the multilayer ceramic capacitor and the board.

Such an intermediate medium may be implemented by resin used for manufacturing a substrate, and as the intermediate medium is formed of a material having elasticity, the intermediate medium may absorb vibrations of the multilayer ceramic capacitor by elasticity thereof.

Differently from the general configuration described above, in the first example embodiment, as the second ceramic body 210 of the ceramic chip 200 is manufactured using ceramic including alumina ($Al_2O_3$) which does not elastically change and is a hard material such that a printed circuit board and the multilayer ceramic capacitor 100 may be spaced apart towards the ceramic chip 200, and accordingly, vibrations transmitted from the multilayer ceramic capacitor 100 may be blocked.

In the example embodiment, a ratio (G1/M1) of a spacing distance (G1) between the first ceramic body 110 and the second ceramic body 210 in a thickness direction to a length (M1) of a margin portion between the internal electrodes 121 and 122 and a lower surface of the first ceramic body 110 may satisfy 1.0 to 2.5. In other words, the ratio may satisfy $1.0 \leq G1/M1 \leq 2.5$.

In one example, the spacing distance (G1) may mean a dimension of the space between the first ceramic body 110 and the second ceramic body 210 in the thickness direction T, and may be one of an average dimension, a maximum dimension, and a dimension measured in a center portion of the composite body 300.

In one example, the spacing distance (G1) may be determined by defining a predetermined number (e.g., 5) of points to the left and the predetermined number (e.g., 5) of points to the right from a reference center point of the space between the first ceramic body 110 and the second ceramic body 210 at equal intervals (or non-equal intervals, alternatively), measuring a dimension, in the thickness direction T, of the space at equal intervals (or non-equal intervals, alternatively), and obtaining an average value therefrom, based on an image of a cross-section in an L-T plane, scanned by, for example, a scanning electron microscope (SEM). The reference center point may have the same distance, or substantially the same distance in consideration of a measurement error, from opposing edges in the cross-section cut. In this case, the spacing distance (G1) may be an average. Alternatively, the spacing distance (G1) may be determined and measured in a W-T plane. The length (M1) (or a dimension) of the margin portion between the internal electrode 121 or 122 and the lower surface of the first ceramic body 110 in the thickness direction T may be defined similar to the spacing distance (G1).

Alternatively, the spacing distance (G1) may be determined by defining a predetermined number (e.g., 5) of points to the left and the predetermined number (e.g., 5) of points to the right from a reference center point of the space between the first ceramic body 110 and the second ceramic body 210 at equal intervals (or non-equal intervals, alternatively), measuring a dimension of the space at equal intervals (or non-equal intervals, alternatively), and obtaining a maximum value therefrom, based on an image of a cross-section cut in an L-T plane, scanned by, for example, a scanning electron microscope (SEM). In this case, the spacing distance (G1) may be a maximum distance. Alternatively, the spacing distance (G1) may be determined and measured in a W-T plane. The length (M1) (or a dimension) of the margin portion between the internal electrode 121 or 122 and the lower surface of the first ceramic body 110 in the thickness direction T may be defined similar to the spacing distance (G1).

Alternatively, the spacing distance (G1) may be a dimension of the space at a reference center point, based on an image of a cross-section cut in an L-T plane scanned by, for example, a scanning electron microscope (SEM). The reference center point may have the same distance, or substantially the same distance in consideration of a measurement error, from opposing edges of in the cross-section cut. Alternatively, the spacing distance (G1) may be determined and measured in a W-T plane. The length (M1) (or a dimension) of the margin portion between the internal electrode 121 or 122 and the lower surface of the first ceramic body 110 in the thickness direction T may be defined similar to the spacing distance (G1).

To reduce acoustic noise, there have been studies on a composite electronic component in which a substrate is used on a lower surface of a multilayer ceramic capacitor.

However, specific studies on a size of a multilayer ceramic capacitor, a mounting method, a size of a ceramic chip disposed in a lower portion, and a degree of removal of acoustic noise according to a size of an electrode have not been properly conducted. Thus, it has been necessary to conduct studies on a threshold in relation to a degree of an effect of acoustic noise according to a distance between a multilayer ceramic capacitor and a ceramic chip disposed on a lower surface, and a gap between lower margin portions of internal electrodes disposed in a multilayer ceramic capacitor, and numerical values of the threshold has been suggested in the example embodiment.

While having studied on the example embodiment, it has been found that a distance between a ceramic chip attached on a lower surface of the multilayer ceramic capacitor to reduce acoustic noise and a multilayer ceramic capacitor, that is, a distance between the second ceramic body of the ceramic chip and the first ceramic body of the multilayer ceramic capacitor in a thickness direction could be relevant to acoustic noise generated by vibrations of the multilayer ceramic capacitor.

The greater the distance between the first ceramic body of the multilayer ceramic capacitor and the second ceramic body of the ceramic chip in the thickness direction, the more the magnitude of vibrations of the multilayer ceramic capacitor transmitted to the ceramic chip may be reduced such that noise may be reduced, and when the distance increases to a predetermined limit point or further, the effect of reducing the noise may not increase.

Also, as there may be a limitation in design with respect to a size of a product, a height of a product in particular, an appropriate distance should be determined in consideration of the effect of reducing acoustic noise.

Meanwhile, in the composite electronic component in the example embodiment, the internal electrodes of the multilayer ceramic capacitor may be layered perpendicularly to amounting surface of the composite body.

In this case, a region of a lower margin portion of the multilayer ceramic capacitor on which the internal electrode is not printed may work as an intermediate medium which transmits vibrations generated from the region in which the internal electrodes are disposed to the ceramic chip disposed therebelow.

A transmission mechanism of vibration of the multilayer ceramic capacitor may be affected by correlation between the length (M1) of the lower margin portion in the first ceramic body 110 of the multilayer ceramic capacitor 100 and the spacing distance (G1) between the second ceramic body 210 of the ceramic chip 200 and the first ceramic body 110 of the multilayer ceramic capacitor 100 in a thickness direction, and accordingly, there may be a difference in acoustic noise.

In the first example embodiment, by adjusting the ratio (G1/M1) of the spacing distance (G1) between the first ceramic body 110 and the second ceramic body 210 in the thickness direction to the length (M1) of the margin portion between the internal electrodes 121 and 122 and the lower surface of the first ceramic body to satisfy 1.0 to 2.5, acoustic noise may be greatly reduced.

In other words, acoustic noise may be reduced when G1 and M1 satisfy G1/M1≤1.0, and when the ratio (G1/M1) of the spacing distance (G1) between the first ceramic body 110 and the second ceramic body 210 in the thickness direction to the length (M1) of the margin portion between the internal electrodes 121 and 122 and the lower surface of the first ceramic body exceeds 2.5, that is, when G1 and M1 satisfy G1/M1>2.5, for example, the effect of reducing the noise was not significant.

Also, when the value of G1/M1 increases, a size of the composite electronic component may also increase. Thus, according to the first example embodiment, the effect of reducing the noise may be optimal when the ratio (G1/M1) of the spacing distance (G1) between the first ceramic body 110 and the second ceramic body 210 in the thickness direction to the length (M1) of the margin portion between the internal electrodes 121 and 122 and the lower surface of the first ceramic body satisfies 1.0 to 2.5.

When the length (M1) of the margin portion between the internal electrodes 121 and 122 and the lower surface of the first ceramic body 110 and the spacing distance (G1) between the first ceramic body 110 and the second ceramic body 210 in the thickness direction satisfy M1<G1, a piezoelectric phenomenon of the multilayer ceramic capacitor may be effectively prevented such that the effect of reducing acoustic noise may improve.

According to the first example embodiment, the spacing distance (G1) between the first ceramic body 110 and the second ceramic body 210 in the thickness direction may satisfy 30 μm≤G1≤120 μm.

By adjusting the spacing distance (G1) between the first ceramic body 110 and the second ceramic body 210 in the thickness direction to satisfy 30 μm≤G1≤120 μm, acoustic noise may be reduced.

The more the spacing distance (G1) between the first ceramic body 110 and the second ceramic body 210 in the thickness direction increases, the more the acoustic noise may be reduced. However, when the spacing distance (G1) increases excessively, a size of the composite electronic component may increase. Thus, G1 may have an upper limit value due to a limitation in height of the product.

In other words, when the spacing distance (G1) between the first ceramic body 110 and the second ceramic body 210 in the thickness direction is less than 30 µm, the effect of reducing acoustic noise may not be sufficient, and when the spacing distance (G1) exceeds 120 µm, a size of the product may increase, which may not be preferable.

More preferably, the spacing distance (G1) between the first ceramic body 110 and the second ceramic body 210 in the thickness direction may satisfy 50 µm≤G1≤100 µm.

By adjusting the spacing distance (G1) between the first ceramic body 110 and the second ceramic body 210 in the thickness direction to satisfy 50 µm≤G1≤100 µm, the effect of reducing acoustic noise may improve.

When the spacing distance (G1) between the first ceramic body 110 and the second ceramic body 210 in the thickness direction is less than 50 µm, the effect of reducing acoustic noise may not be sufficient, and when the spacing distance (G1) exceeds the 100 µm, a size of the product may increase, which may not be preferable.

In the description below, the multilayer ceramic capacitor 100 and the ceramic chip 200 included in the composite body 300 will be described in greater detail.

Referring to FIG. 2, the first ceramic body 110 included in the multilayer ceramic capacitor 100 may be formed by layering the plurality of dielectric layers 111, and the plurality of internal electrodes 121 and 122 (the first and second internal electrodes in order) may be disposed in the first ceramic body 110 and may be separated from each other with the dielectric layer 111 interposed therebetween.

The plurality of dielectric layers 111 included in the first ceramic body 110 may be in a sintered state, and a boundary between adjacent dielectric layers may be integrated with each other such that the boundary may not be distinct.

The dielectric layer 111 may be formed by firing ceramic green sheets including ceramic power, an organic solvent, and an organic binder. The ceramic power may have a high dielectric constant, and although not limited thereto, a barium titanate (BaTiO3)-based material, a strontium titanate (SrTiO3)-based material, or the like, may be used as the ceramic powder.

The dielectric layers 111 forming the first ceramic body 110 may include a ferroelectric material, but an example embodiment thereof is not limited thereto.

According to the first example embodiment, the internal electrode may include a first internal electrode 121 exposed to a first side surface of the composite body 300 disposed in a length direction and a second internal electrode 122 exposed to a second side surface disposed in a length direction, but an example embodiment thereof is not limited thereto.

The first and second internal electrodes 121 and 122 may be formed using conductive paste including a conductive metal.

The conductive metal may be implemented by nickel (Ni), copper (Cu), palladium (Pd), or alloys thereof, although the conductive metal is not limited thereto.

The first and second internal electrodes 121 and 122 may be printed on the ceramic green sheet, which forms the dielectric layer 111, using conductive paste through a printing method such as a screen-printing method or a gravure printing method.

The first ceramic body 110 may be formed by alternately layering ceramic green sheets on each of which the internal electrode is printed and firing the ceramic green sheets.

The plurality of first and second internal electrodes 121 and 122 may be vertically disposed on an upper surface and a lower surface of the first ceramic body 110.

The first and second external electrodes 131 and 132 may be formed by conductive paste including a conductive metal, and the conductive metal may be nickel (Ni), copper (Cu), palladium (Pd), gold (Au), or alloys thereof, but an example embodiment thereof is not limited thereto.

A nickel/tin (Ni/Sn) plated layer may further be disposed on the first and second external electrodes 131 and 132.

According to the first example embodiment, the ceramic chip 200 may be bonded to and disposed below the multilayer ceramic capacitor 100.

The ceramic chip 200 may have a shape in which the first and second terminal electrodes 231 and 232 connected to the first and second external electrodes 131 and 132 are disposed on both ends of the second ceramic body 210 manufactured in a bulk form using ceramic.

Generally, to reduce vibrations of the multilayer ceramic capacitor transmitted to a printed circuit board, there has been an attempt to insert an intermediate medium between the multilayer ceramic capacitor and the board.

The intermediate medium may be implemented by resin used for manufacturing a substrate, and as the intermediate medium is formed of a material having elasticity, the intermediate medium may absorb vibrations of the multilayer ceramic capacitor by elasticity thereof.

Differently from the above-described configuration, in the first example embodiment, the second ceramic body 210 of the ceramic chip 200 may be manufactured using only hard ceramic which does not elastically change such that a printed circuit board and the multilayer ceramic capacitor 100 may be spaced apart towards the ceramic chip 200, and accordingly, vibrations generated from the multilayer ceramic capacitor 100 may be prevented from being transmitted.

According to the first example embodiment, the ceramic may include alumina ($Al_2O_3$).

As alumina ($Al_2O_3$) has no piezoelectric properties, alumina ($Al_2O_3$) may prevent vibrations generated from the multilayer ceramic capacitor 100 from being transmitted, and accordingly, the ceramic chip 200 including alumina ($Al_2O_3$) may be disposed below the multilayer ceramic capacitor 100 and acoustic noise may be reduced.

The first and second terminal electrodes 231 and 232 may not be limited to any particular example. For example, the first and second terminal electrodes 231 and 232 may have a dual layer structure including first and second conductive resin layers disposed internally and first and second plating layers disposed externally.

According to the first example embodiment, as the first and second terminal electrodes 231 and 232 have a dual layer structure including first and second conductive resin layers disposed internally and first and second plating layers disposed externally as described above, when external mechanical stress is applied, the stress may be prevented from being transmitted to the multilayer ceramic capacitor 100 by the conductive resin layer used for the ceramic chip 200 and the terminal electrodes 231 and 232 of the ceramic chip 200 such that damage caused by cracks in the multilayer ceramic capacitor may be prevented.

The first and second conductive resin layers may include a conductive metal and a thermosetting resin, but an example embodiment thereof is not limited thereto. For example, the first and second conductive resin layers may include silver (Ag) and an epoxy resin.

In the multilayer ceramic capacitor according to the first example embodiment, the plurality of first and second internal electrodes 121 and 122 may be vertically disposed on an upper surface and a lower surface of the first ceramic body 110.

Accordingly, the first and second internal electrodes 121 and 122 may be layered perpendicularly to a mounting surface when the composite body 300 is mounted on a printed circuit board. In one example, an element is perpendicular to another element may mean that the element is perfectly perpendicular to the another element. Alternatively, an element is perpendicular to another element may mean the element is substantially perpendicular to the another element in consideration of recognizable errors which may occur during manufacturing or measurement.

Generally, when a voltage is applied to a multilayer ceramic capacitor, a ceramic body may expand and reduce in a length direction, a width direction, and a thickness direction by an inverse piezoelectric effect of a dielectric layer.

When the amount of displacement of a length-width surface (an L-W surface), a width-thickness surface (a W-T surface) and a length-thickness surface (an L-T surface) of the ceramic body is measured by a laser Doppler vibrometer (LDV), the amount of displacement may appear in order of L-W face>W-T face>L-T surface.

The amount of displacement of the L-T surface compared to the W-T surface may be about 42%, which may appear to be less than the amount of displacement of the W-T surface. That is because, even though the same level of stress may be generated on the L-T surface and the W-T surface, as the L-T surface may have an area larger than an area of the W-T surface, a similar level of stress may be distributed throughout the large area such that relatively small deformation may occur presumably.

Accordingly, in a general multilayer ceramic capacitor, the amount of displacement may be the least on the L-T surface.

According to the first example embodiment, by vertically layering the first and second internal electrodes 121 and 122 on an upper surface and a lower surface of the first ceramic body 110, the first and second internal electrodes 121 and 122 may be disposed perpendicularly to a mounting surface when the composite body 300 is mounted on a printed circuit board such that the amount of vibrations of the surface in contact with the ceramic chip 200 may be reduced.

Figure 4:
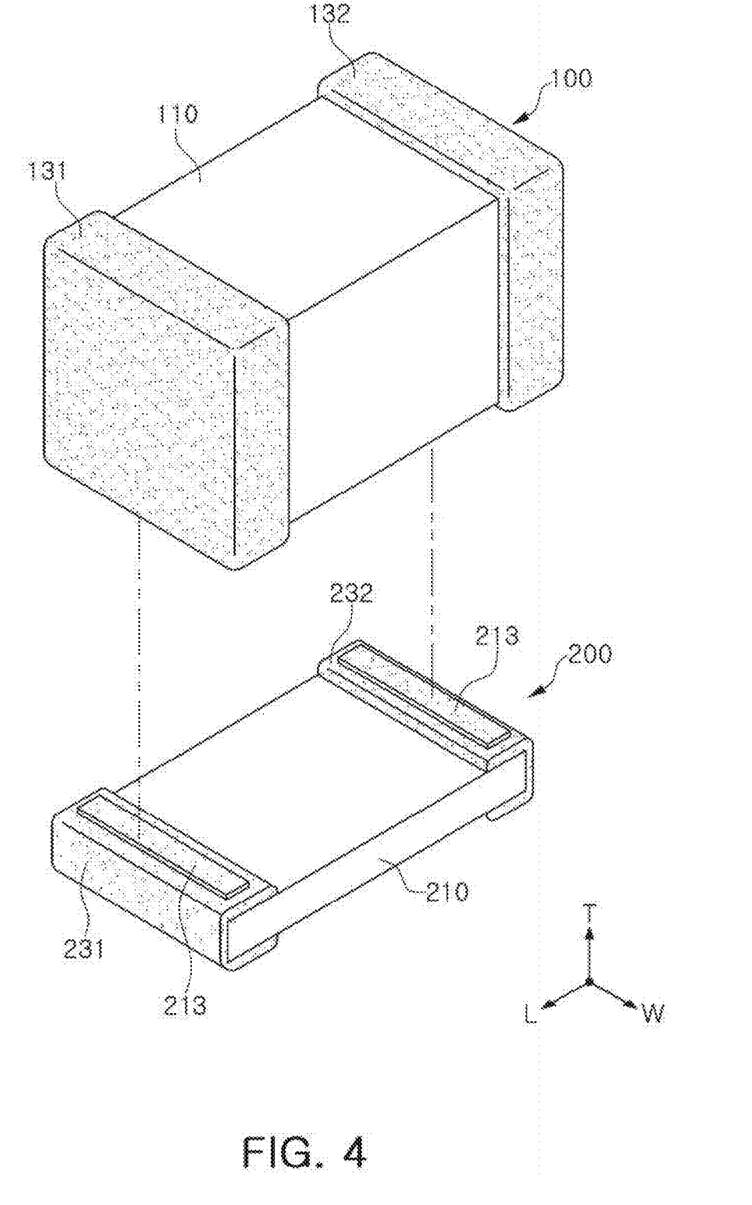
FIG. 4 is an exploded perspective diagram illustrating a composite electronic component divided into a multilayer ceramic capacitor and a ceramic chip.

FIG. 4 is an exploded perspective diagram illustrating a composite electronic component divided into a multilayer ceramic capacitor and a ceramic chip.

The composite body 300 may be formed by bonding the multilayer ceramic capacitor 100 to the ceramic chip 200, and a method of forming the composite body 300 may not be limited to any particular method.

The forming the composite body 300 may including bonding the multilayer ceramic capacitor 100 to the ceramic chip 200, which are separately manufactured, using solder or a conductive adhesive 213.

The conductive adhesive 213 may be implemented by paste including a conductive metal and an epoxy resin, but an example embodiment thereof is not limited thereto.

Referring to FIG. 4, when the multilayer ceramic capacitor 100 and the ceramic chip 200 are bonded to each other using solder or the conductive adhesive 213, solder or the conductive adhesive 213 may be applied to upper surfaces of a first terminal electrode 231 and a second terminal electrode 232 and may be bonded to the first and second external electrodes 131 and 132 of the multilayer ceramic capacitor 100.

Solder and the conductive adhesive 213 may be applied to the upper surfaces of a first terminal electrode 231 and a second terminal electrode 232 and may be fixed along with the ceramic chip 200 on a lower surface of the multilayer ceramic capacitor 100. Accordingly, only vibrations of a length-width surface (an L-W surface) of the first ceramic body 110 may be transmitted to the ceramic chip 200.

Accordingly, stress and vibrations generated from the multilayer ceramic capacitor, which may be transmitted to the ceramic chip, may be reduced such that acoustic noise may be reduced.

A composite electronic component according to a second example embodiment may include a composite body 300 including a multilayer ceramic capacitor 100 which includes a first ceramic body 110 in which a plurality of dielectric layers 111 and internal electrodes 121 and 122 disposed to oppose each other with the dielectric layer 111 interposed therebetween are layered and first and second external electrodes 131 and 132 disposed on both ends of the first ceramic body 110, and a ceramic chip 200 disposed below the multilayer ceramic capacitor 100 and including a second ceramic body 210 including ceramic, and first and second terminal electrodes 231 and 232 disposed on both ends of the second ceramic body 210 and connected to the first and second external electrodes 131 and 132, where the multilayer ceramic capacitor 100 and the ceramic chip 200 are bonded to each other. Also, a length (M1) of a margin portion between the internal electrodes 121 and 122 and a lower surface of the first ceramic body 110 and a spacing distance (G1) between the first ceramic body 110 and the second ceramic body 210 in a thickness direction may satisfy M1<G1.

When the length (M1) of a margin portion between the internal electrodes 121 and 122 and the lower surface of the first ceramic body 110 and the spacing distance (G1) between the first ceramic body 110 and the second ceramic body 210 in a thickness direction satisfy M1<G1, a piezoelectric phenomenon of the multilayer ceramic capacitor may be effectively prevented such that an effect of reducing acoustic noise may improve.

According to the second example embodiment, a ratio (G1/M1) of the spacing distance (G1) between the first ceramic body 110 and the second ceramic body 210 in the thickness direction to the length (M1) of the margin portion between the internal electrodes 121 and 122 and the lower surface of the first ceramic body may satisfy 1.0<G1/M1≤2.5.

As the ratio (G1/M1) of the spacing distance (G1) between the first ceramic body 110 and the second ceramic body 210 in the thickness direction to the length (M1) of the margin portion between the internal electrodes 121 and 122 and the lower surface of the first ceramic body satisfies 1.0<G1/M1≤2.5, an effect of reducing acoustic noise may improve.

The descriptions of the features and elements of the second example embodiment which are the same as in the first and second example embodiments will not be repeated.

In the description below, an embodiment will be described in greater detail, but an embodiment of the present disclosure is not limited thereto.

Experimental Example

A composite electronic component in an embodiment and a comparative example was manufactured as below.

In the embodiment and the comparative example, a ceramic chip was disposed below a multilayer ceramic capacitor, and the composite electronic component was manufactured according to a mounted form of internal electrodes of the multilayer ceramic capacitor, and acoustic noise values were compared according to a spacing distance (G1) between the first ceramic body 110 and the second ceramic body 210 in the thickness direction and a ratio (G1/M1) of the spacing distance (G1) between the first ceramic body 110 and the second ceramic body 210 in the thickness direction to a length (M1) of a margin portion between internal electrodes 121 and 122 and a lower surface of the first ceramic body 110.

Specifically, Table 1 indicates an example in which the internal electrodes are stacked perpendicularly to a mounting surface of a substrate, and acoustic noise values according to the spacing distance (G1) between the first ceramic body 110 and the second ceramic body 210 in the thickness direction and the ratio (G1/M1) of the spacing distance (G1) between the first ceramic body 110 and the second ceramic body 210 in the thickness direction to the length (M1) of the margin portion between the internal electrodes 121 and 122 and the lower surface of the first ceramic body 110 were compared.

In the experiment, it was determined that there was an effect of reducing acoustic noise when an acoustic noise value was 30 dBA or lower, and in particular, it was determined that the effect of reducing acoustic noise was significant when an acoustic noise value was less than 30 dBA.

TABLE 1

|   | G1 (µm) | G1/M1 | Acoustic Noise (dBA) |
|---|---|---|---|
| *1 | 10 | 0.33 | 37 |
| 2 | 30 | 1.00 | 30 |
| 3 | 50 | 1.67 | 27 |
| 4 | 80 | 2.50 | 25 |
| *5 | 120 | 4.00 | 28 |
| *6 | 150 | 5.00 | 29 |
| *7 | 10 | 0.20 | 35 |
| *8 | 30 | 0.60 | 29 |
| 9 | 50 | 1.00 | 27 |
| 10 | 80 | 1.60 | 24 |
| 11 | 120 | 2.40 | 23 |
| *12 | 150 | 3.00 | 26 |
| *13 | 10 | 0.10 | 34 |
| *14 | 30 | 0.30 | 29 |
| *15 | 50 | 0.50 | 27 |
| *16 | 80 | 0.80 | 26 |
| 17 | 120 | 1.20 | 23 |
| 18 | 100 | 1.50 | 24 |

*Comparative Example

Referring to Table 1 above, as for samples 2 to 4, 9 to 11, 17, and 18, which are embodiments, the spacing distance (G1) between the first ceramic body 110 and the second ceramic body 210 in the thickness direction satisfied 30 µm≤G1≤120 µm, and the ratio (G1/M1) of the spacing distance (G1) between the first ceramic body 110 and the second ceramic body 210 in the thickness direction to the length (M1) of the margin portion between the internal electrodes 121 and 122 and the lower surface of the first ceramic body 110 satisfied 1.0 to 2.5 such that an acoustic noise value was relatively low.

Particularly, when the ratio (G1/M1) of the spacing distance (G1) between the first ceramic body 110 and the second ceramic body 210 in the thickness direction to the length (M1) of the margin portion between the internal electrodes 121 and 122 and the lower surface of the first ceramic body 110 satisfied G1/M1>1.0, an effect of reducing acoustic noise improved.

As for samples 1, 5 to 8, and 12 to 16, which are comparative examples, the ratio (G1/M1) of the spacing distance (G1) between the first ceramic body 110 and the second ceramic body 210 in the thickness direction to the length (M1) of the margin portion between the internal electrodes 121 and 122 and the lower surface of the first ceramic body 110 did not satisfy the range of 1.0 to 2.5 such that there was no effect of reducing acoustic noise.

Particularly, as for samples 1, 6, 7, 12, and 13 of the comparative examples, the spacing distance (G1) between the first ceramic body 110 and the second ceramic body 210 did not satisfy the range of 30 µm≤G1≤120 µm such that an acoustic noise value was high, and accordingly, the samples 1, 6, 7, 12, and 13 were determined as comparative examples.

According to the aforementioned example embodiments, stress or vibrations caused by piezoelectric properties of the multilayer ceramic capacitor may be alleviated by the ceramic chip such that acoustic noise generated from a circuit substrate may be reduced.

Also, by optimizing a distance between the first ceramic body of the multilayer ceramic capacitor and the second ceramic body of the ceramic chip disposed on a lower surface and a gap between lower margin portions of the internal electrodes disposed in the multilayer ceramic capacitor, an effect of reducing acoustic noise may improve.

Also, as the internal electrodes of the multilayer ceramic capacitor are stacked in a direction perpendicular to a mounting surface, and a surface taken in a length-width direction on which the amount of piezoelectric displacement is relatively small is bonded to the ceramic chip, stress and vibrations generated from the multilayer ceramic capacitor which may be transmitted to the ceramic chip may be reduced such that acoustic noise may be reduced.

While the exemplary embodiments have been shown and described above, it will be apparent to those skilled in the art that modifications and variations could be made without departing from the scope of the present invention as defined by the appended claims.

What is claimed is:

1. A composite electronic component, comprising:
    a composite body including:
        a multilayer ceramic capacitor including a first ceramic body in which a plurality of dielectric layers and internal electrodes disposed to oppose each other with a respective one of the plurality of dielectric layers interposed therebetween are layered, and first and second external electrodes disposed on both ends of the first ceramic body; and
        a ceramic chip disposed below the multilayer ceramic capacitor and including a second ceramic body including ceramic, and first and second terminal electrodes disposed on both ends of the second ceramic body and respectively connected to the first and second external electrodes,
    wherein a ratio (G1/M1) of a spacing distance (G1) between the first ceramic body and the second ceramic body in a thickness direction to a length (M1) of a margin portion between the internal electrode and a lower surface of the first ceramic body satisfies 1.0 to 2.5.

2. The composite electronic component of claim 1, wherein the length (M1) of the margin portion between the internal electrode and the lower surface of the first ceramic body and the spacing distance (G1) between the first ceramic body and the second ceramic body in the thickness direction satisfy M1<G1.

3. The composite electronic component of claim 1, wherein the spacing distance (G1) between the first ceramic body and the second ceramic body in the thickness direction satisfies 30 µm≤G1≤120 µm.

4. The composite electronic component of claim 1, wherein the spacing distance (G1) between the first ceramic body and the second ceramic body in the thickness direction satisfies 50 µm≤G1≤100 µm.

5. The composite electronic component of claim 1, wherein the internal electrodes in the first ceramic body are layered perpendicularly to amounting surface of the composite body.

6. The composite electronic component of claim 1, wherein the internal electrodes are layered perpendicularly to the lower surface of the first ceramic body, and
the lower surface of the first ceramic body faces the ceramic chip.

7. The composite electronic component of claim 1, wherein the multilayer ceramic capacitor and the ceramic chip are bonded to each other by solder or a conductive adhesive applied on upper surfaces of the first terminal electrode and the second terminal electrode.

8. The composite electronic component of claim 1, wherein the thickness direction is a stacking direction along which the ceramic chip and the multilayer ceramic capacitor are stacked.

9. A composite electronic component, comprising:
a composite body including:
a multilayer ceramic capacitor including a first ceramic body in which a plurality of dielectric layers and internal electrodes disposed to oppose each other with a respective one of the plurality of dielectric layers interposed therebetween are layered, and first and second external electrodes disposed on both ends of the first ceramic body; and
a ceramic chip disposed below the multilayer ceramic capacitor and including a second ceramic body including ceramic, and first and second terminal electrodes disposed on both ends of the second ceramic body and respectively connected to the first and second external electrodes,
wherein a length (M1) of a margin portion between the internal electrode and a lower surface of the first ceramic body and a spacing distance (G1) between the first ceramic body and the second ceramic body in a thickness direction satisfy M1<G1.

10. The composite electronic component of claim 9, wherein a ratio (G1/M1) of the spacing distance (G1) between the first ceramic body and the second ceramic body in the thickness direction to the length (M1) of the margin portion between the internal electrode and the lower surface of the first ceramic body satisfies 1.0<G1/M1≤2.5.

11. The composite electronic component of claim 9, wherein the spacing distance (G1) between the first ceramic body and the second ceramic body in the thickness direction satisfies 30 µm≤G1≤120 µm.

12. The composite electronic component of claim 9, wherein the spacing distance (G1) between the first ceramic body and the second ceramic body in the thickness direction satisfies 50 µm≤G1≤100 µm.

13. The composite electronic component of claim 9, wherein the internal electrodes in the first ceramic body are layered perpendicularly to amounting surface of the composite body.

14. The composite electronic component of claim 9, wherein the internal electrodes are layered perpendicularly to the lower surface of the first ceramic body, and
the lower surface of the first ceramic body faces the ceramic chip.

15. The composite electronic component of claim 9, wherein the multilayer ceramic capacitor and the ceramic chip are bonded to each other by solder or a conductive adhesive applied on upper surfaces of the first terminal electrode and the second terminal electrode.

16. The composite electronic component of claim 9, wherein the thickness direction is a stacking direction along which the ceramic chip and the multilayer ceramic capacitor are stacked.

* * * * *